United States Patent
Cheng et al.

(10) Patent No.: US 8,437,215 B2
(45) Date of Patent: May 7, 2013

(54) MEMORY WITH WORD-LINE SEGMENT ACCESS

(75) Inventors: Chiting Cheng, Taichung (TW); Hsiu-Feng Peng, Zhubei (TW); Ming-Zhang Kuo, Xigang Shiang (TW); Chung-Cheng Chou, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 175 days.

(21) Appl. No.: 13/010,039

(22) Filed: Jan. 20, 2011

(65) Prior Publication Data

US 2012/0188838 A1 Jul. 26, 2012

(51) Int. Cl.
*G11C 8/00* (2006.01)
(52) U.S. Cl.
USPC .......... 365/230.06; 365/230.02; 365/189.02
(58) Field of Classification Search .......... 365/230.06, 365/230.02, 189.02
See application file for complete search history.

(56) References Cited

U.S. PATENT DOCUMENTS

| | | | |
|---|---|---|---|
| 5,406,526 A | 4/1995 | Sugibayashi et al. | |
| 6,510,094 B2 | 1/2003 | Chung et al. | |
| 7,177,169 B2* | 2/2007 | Scheuerlein | 365/51 |
| 7,426,141 B2* | 9/2008 | Takeuchi | 365/185.11 |
| 8,004,912 B2* | 8/2011 | Terzioglu et al. | 365/200 |
| 8,130,582 B2* | 3/2012 | Shimano et al. | 365/210.1 |
| 2005/0068840 A1 | 3/2005 | Park et al. | |

* cited by examiner

*Primary Examiner* — Son Dinh
*Assistant Examiner* — Nam Nguyen
(74) *Attorney, Agent, or Firm* — Duane Morris LLP; Steven E. Koffs

(57) ABSTRACT

A memory comprises a row of bit cells, including a first plurality of bit cells and a second plurality of bit cells. A first word line segment driver is connected to the first plurality of bits cells. A second word line segment driver is connected to the second plurality of bits cells. The first and second word line segment drivers are selectively operable for activating one of the first and second pluralities of bit cells at a time to the exclusion of the other plurality of bit cells. A shared sense amplifier is coupled to at least one of the first plurality of bit cells and at least one of the second plurality of bit cells. The shared sense amplifier is configured to receive signals from whichever of the one first or second bit cell is activated by its respective word line segment driver at a given time.

21 Claims, 6 Drawing Sheets

MEMORY WITH WORD-LINE SEGMENT ACCESS

FIELD

This disclosure is related to memory devices generally, and more specifically to memories with word-line segment access capability.

BACKGROUND

Static Random Access Memory (SRAM) is a type of memory that does not require periodic refreshing (as does DRAM), but retains its data as long as the power to the memory remains turned on.

Each bit in an SRAM is stored on four transistors that form two cross-coupled inverters. Access to the cell is enabled by the word line which controls two access transistors. These access transistors control whether the cell will be connected to the bit lines: BL and BL_bar. If the cell stores a 1, a read cycle is started by precharging both the bit lines to a logical 1, then asserting the word line WL, enabling both the access transistors. Next, the stored values are transferred to the bit lines by leaving BL at its precharged value and discharging BL_bar through the access transistors to a logical 0. The access transistors pull BL toward $V_{DD}$, a logical 1. If the cell contains a 0, BL_bar is pulled toward 1 and BL toward 0. Then a sense amplifier will sense a small difference between BL and BL_bar, and determine which line has higher voltage. The sense amplifier thus determines whether a 1 or 0 was stored in the SRAM.

In the above-described read access cycle, all of the cells connected to the asserted word line WL are "developed", and start to pull their respective bit lines from $V_{DD}$ to ground, by more than 100 millivolts. These "dummy reads" do not read data out of every bit cell connected to that word line, but they all contribute to active power consumption. Further, this precharge in all of the bit lines (BL and BL_bar) generates a large current and cause voltage drop and noise.

DETAILED DESCRIPTION

This description of the exemplary embodiments is intended to be read in connection with the accompanying drawings, which are to be considered part of the entire written description.

Figure 1:
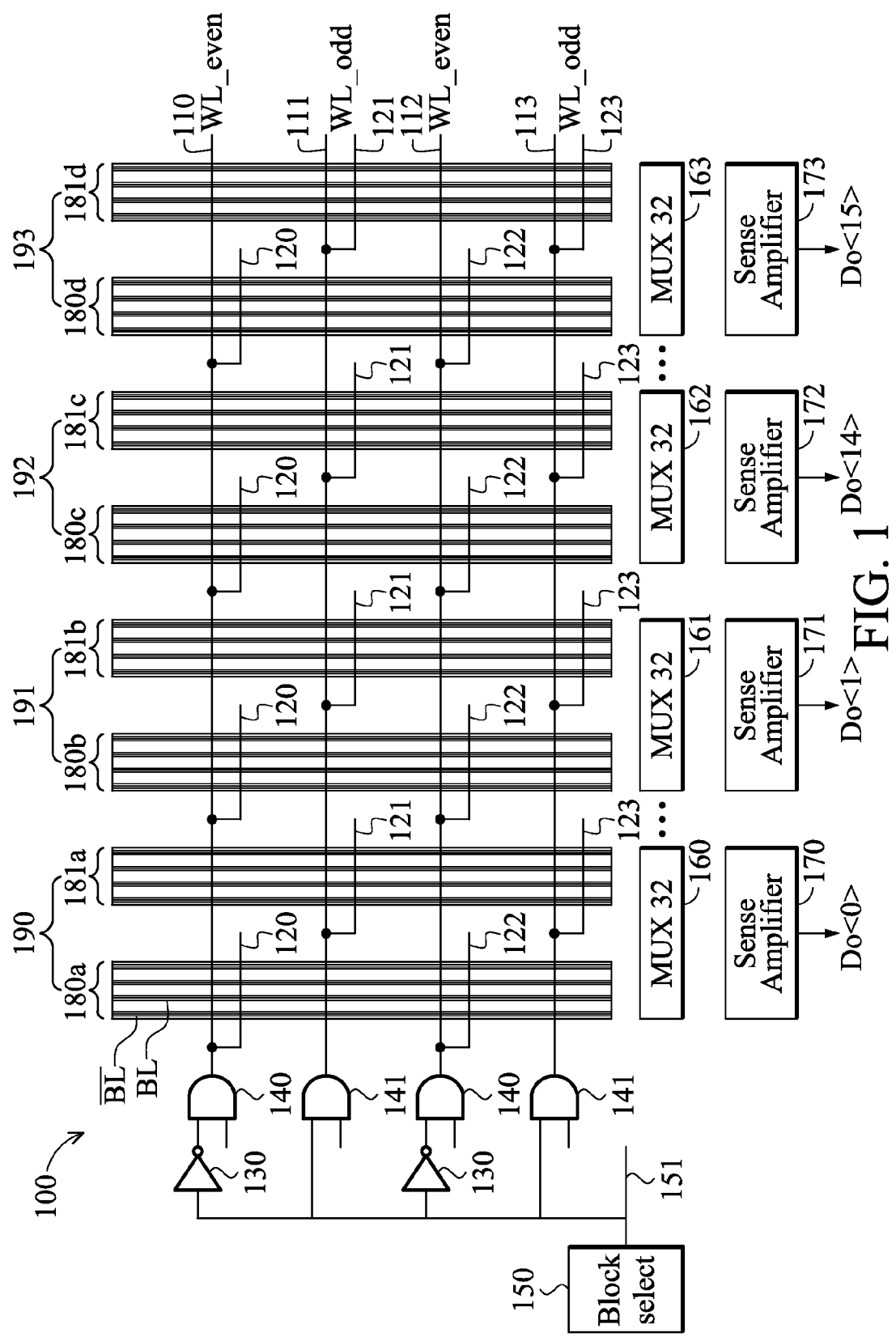
FIG. 1 is a schematic diagram of a memory array configured for sub word-line access.
Figure 2:
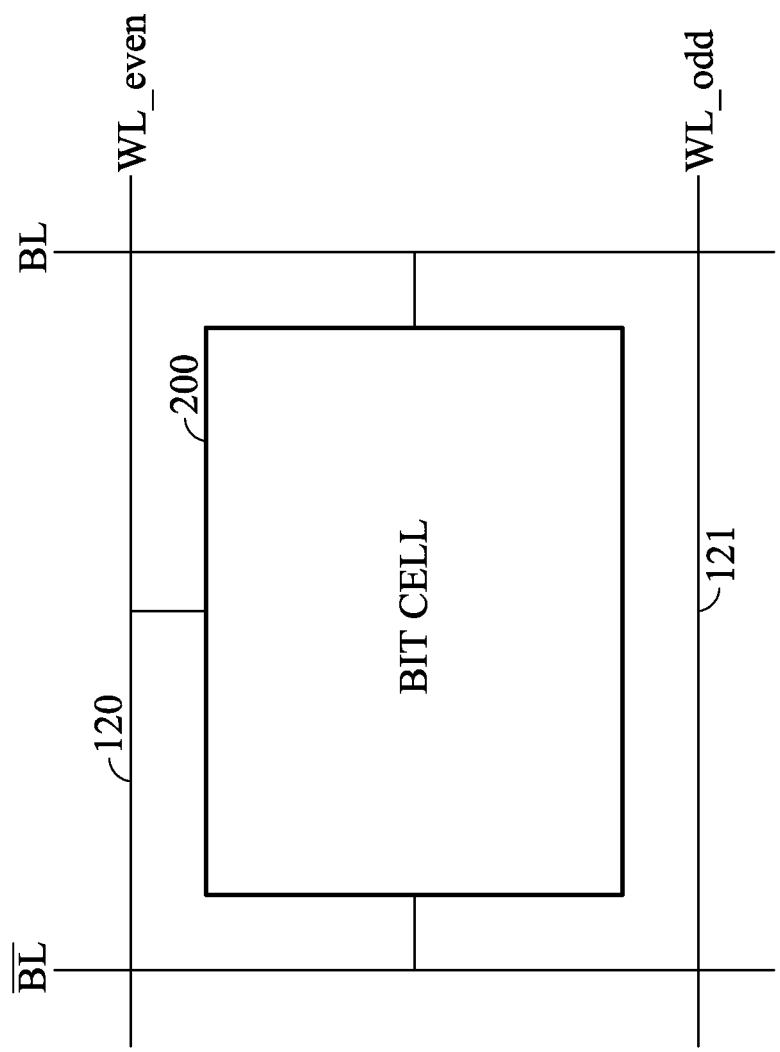
FIG. 2 is an enlarged view of one of the bit cells in the memory of FIG. 1.

FIG. 1 is a block diagram of a memory 100 capable of sub word-line access. In some embodiments, the memory 100 is an SRAM having an array of bit cells 200 (shown in FIG. 2) arranged in rows 110-113 and columns. In a non-limiting example, the memory 100 has 1024 rows, each row having 32 bit cells. For convenience and brevity, the examples discussed herein include memories of this size, but memories having any other row size and column size may be used.

The bit cells 200 may be made according to any of a variety of designs, such as 6T, 8T, or 10T, for example. Each column of bit cells 200 is connected to a respective pair of bit lines BL and BL_bar. Within each row of bit cells 200, each bit cell is connected to either one (but not both) of a WL_even word line 110, 112 or a WL_odd word line 111, 113. Although FIG. 2 only shows one representative bit cell, one of ordinary skill understands that a respective full column of bit cells is arranged between each pair of bit lines BL and BL_bar. Each row of cells 200 has a respective pair of word lines WL_even and WL_odd. Each WL_even line 110, 112 is connected to half of the bit cells, and each WL_odd line 111, 113 is connected the other half of the bit cells. For the example of a memory 100 having 1024 rows of bit cells, there are 1024 WL_even lines and 1024 WL_odd lines.

The line segments 120 and 122 represent the connections of bit cells to the WL_even lines 110, 112 and the line segments 121 and 123 represent the connections of bit cells to the WL_odd lines 111, 113. In some embodiments, these connections 120-123 are made using the conductive interconnects in the line and via layers. In some embodiments, additional line and via layers may be added to the back-end-of-line (BEOL) interconnect structure to accommodate any additional connections provided for the sub word-line segments 180a-180d, 181a-181d.

Within a given row of bit cells 200, the cells are grouped into a first plurality of bit cells divided among a plurality of first subsets (or sub word-line segments) 180a, 180b, 180c, 180d, and a second plurality of bit cells divided among a plurality of second subsets (sub word-line segments) 181a, 181b, 181c, 181d. In the example of memory 100, there are 16 sets 190-193 (only four of which are shown) 16 first subsets 180a-180d (only four of which are shown) and 16 of the second subsets 181a-181d (only four of which are shown).

The first row of bit cells is also arranged in a plurality of sets 190, 191, 192, 193. Each set 190, 191, 192, 193 includes a respective one of the first subsets (sub word-line segments) and a respective one of the second subsets. For example, set 190 includes first subset 180a and second subset 181a; set 191 includes first subset 180b and second subset 181b; set 192 includes first subset 180c and second subset 181c; and set 193 includes first subset 180d and second subset 181d. The plurality of sets 190-193 are arranged so that none of the first subsets 180a-180d are adjacent to each other, and none of the second subsets 181a-181d are adjacent to each other.

A first word line segment driver 130, 140 is connected to the first plurality 180a-180d of bits cells and a second word line segment driver 141 is connected to the second plurality of bits cells 181a-181d. The first word line segment driver 130, 140 and second word line segment driver 141 are selectively operable for activating one of the first plurality 180a-180d of bit cells and the second plurality 181a-181d of bit cells at a time to the exclusion of the other of the first and second pluralities of bit cells. The number of active bit lines and the word line cell loading is reduced by half. Because only one of the first plurality 180a-180d of bit cells and the second plurality 181a-181d of bit cells is activated at any given time during read access, a substantial power savings is realized. The inventors estimate that the total active power savings during both read and write access is about 32% relative to a memory having the same number and type of bit cells, without sub word-line addressing.

Both of the first and second word line segment drivers are connected to receive a shared activation signal 151 for activating only one of the first 180a-180d and second 181a-181d pluralities of bit cells at a time to the exclusion of the other of the first and second pluralities of bit cells.

In some embodiments, the first word line segment driver 130, 140 and second word line segment driver 141 are configured differently from each other. This permits a single block selector signal 151 to be provided to both the first 130, 140 and second 141 word line segment drivers, causing one of the first and second word line segment drivers to activate its respective subsets of bit cells, and the other of the first and second word line segment drivers to de-activate its respective subsets of bit cells at the same time, in response to the same signal 151.

A block selector 150 is provided for selecting one of the first plurality of bit cells and the second plurality of bit cells to be accessed. The block selector 150 is connected to each of the first 130, 140 and second 141 word line segment drivers. In some embodiments, the block selector 150 outputs a logic low signal to access any of the first 16 bits in each group 190-192 (first word-line segments 180a-180d) and a logic high signal to access any of the last 16 bits in each group (second word-line segments 181a-181d). Thus, the block selector 150 determines the signal 151 based on the real location of the data to be accessed.

For example, as shown in FIG. 1, the first word line segment driver includes an AND gate 140 and an inverter 130. The second word line segment driver includes an AND gate 141. When the block selector 150 transmits the selection signal 151 in a logic high state, AND gate 140 receives a logic low signal, and AND gate 141 receives a logic high signal. When the selection signal 151 has a logic low state, AND gate 140 receives a logic high signal, and AND gate 141 receives a logic low signal. Thus, at any given time, one of the gates 140, 141 receives logic high at its top input and the other receives a logic low signal at its top input. For this purpose, in some embodiments, block selector 150 is a switch (e.g., a transistor), capable of outputting either a high or low signal.

The other (bottom) input to both of the two AND gates 140, 141 is the regular word line activation signal that would be provided to select one word line of a memory in the absence of the word-line segment access. This same signal is provided to both AND gates 140, 141. This makes the provision of word-line segment access transparent to external applications. Thus, the externally supplied word line signal is used applied to the bottom input of each AND gate 140, 141 to select one of the WL_even, WL_odd pairs, and the top input to the AND gates 140, 141 determines which of these two lines is accessed.

The memory 100 has a plurality of shared sense amplifiers 170-173. Each set 190-193 of bit cells is coupled to a respective shared sense amplifier 170-173. Thus, the set 190 of bit cells are coupled to shared sense amplifier 170, set 191 of bit cells is coupled to sense amplifier 171, set 192 of bit cells is coupled to sense amplifier 172, and set 193 of bit cells is coupled to sense amplifier 173. Each sense amplifier 170-173 is configured to receive signals from whichever of the first plurality of bit cells or the second plurality of bit cells is activated by the respective word line segment driver thereof at a given time. For example, sense amplifier 170 receives signals from whichever of first plurality of cells 180a or second plurality of cells 181a is activated by driver 130, 140 or driver 141. Sense amplifier 171 receives signals from cells 180b or 181b. Sense amplifier 172 receives signals from cells 180c or 181c. Sense amplifier 172 receives signals from cells 180d or 181d.

Thus, each respective set 190-193 has its own respective sense amplifier 170-173. All of the word-line segments 180a, 181a in a given set 190 share the same common sense amplifier 170. The total number of sense amplifiers 170-173 for a memory having a given size can be the same as for a memory of the same size (same number of rows, same number of columns) without word-line segment addressing. Also, the number of sense amplifiers 170-173 can be the same as the number of output bits, so that there is no need for multiplexers to reduce the number of output signals from the sense amplifiers before outputting data from the memory 100. Nevertheless, in memory 100 of FIG. 1, only half the bit line pairs at a time are developed and pre-charged (either corresponding to subsets 180a-180d, or corresponding to subsets 181a-181d, but not both).

The memory 100 further comprises a plurality of multiplexers 160-163. Each multiplexer 160-163 is connected to receive first data from a respective one of the first subsets 180a-180d and to receive second data from a respective one of the second subsets 181a-181d. Each multiplexer 160-163 has an output connected to a respective sense amplifier 170-173 for selectively outputting one of the group consisting of the first data and the second data.

Using the example of a memory having 512 columns of cells, one embodiment includes 16 sets (e.g., 190) of bit cells. Each set has 32 columns of bit cells (and 32 bit line pairs). Each set (e.g. 190) also has two subsets or word-line segments (e.g., 180a, 181a). Each subset (e.g., 180) has 16 columns of bit cells. During a given read operation, within each set 190-193, either the first subsets (180a-180d) or the second subsets (181a-181d) can be accessed. When the first subsets 180a-180d are activated, only 16 of the 32 bit line pairs in each set are developed and pre-charged. Thus, only a total of 256 bit line pairs out of 512 in the memory are developed and pre-charged. Each of the 16 multiplexers 160-163 receives a control signal (not shown) indicating from which one of its 32 bit line pairs the multiplexer passes the voltage to the sense amplifier. Each sense amplifier 170-173 receives the voltages of one bit line pair from its respective multiplexer 160-163.

Because only one half of the bit line pairs (e.g., 16 of the 32 pairs) in each set are activated, the total capacitance of the lines that are pre-charged is reduced. This may improve the speed of the memory access, both for reading and storing.

Figure 3:
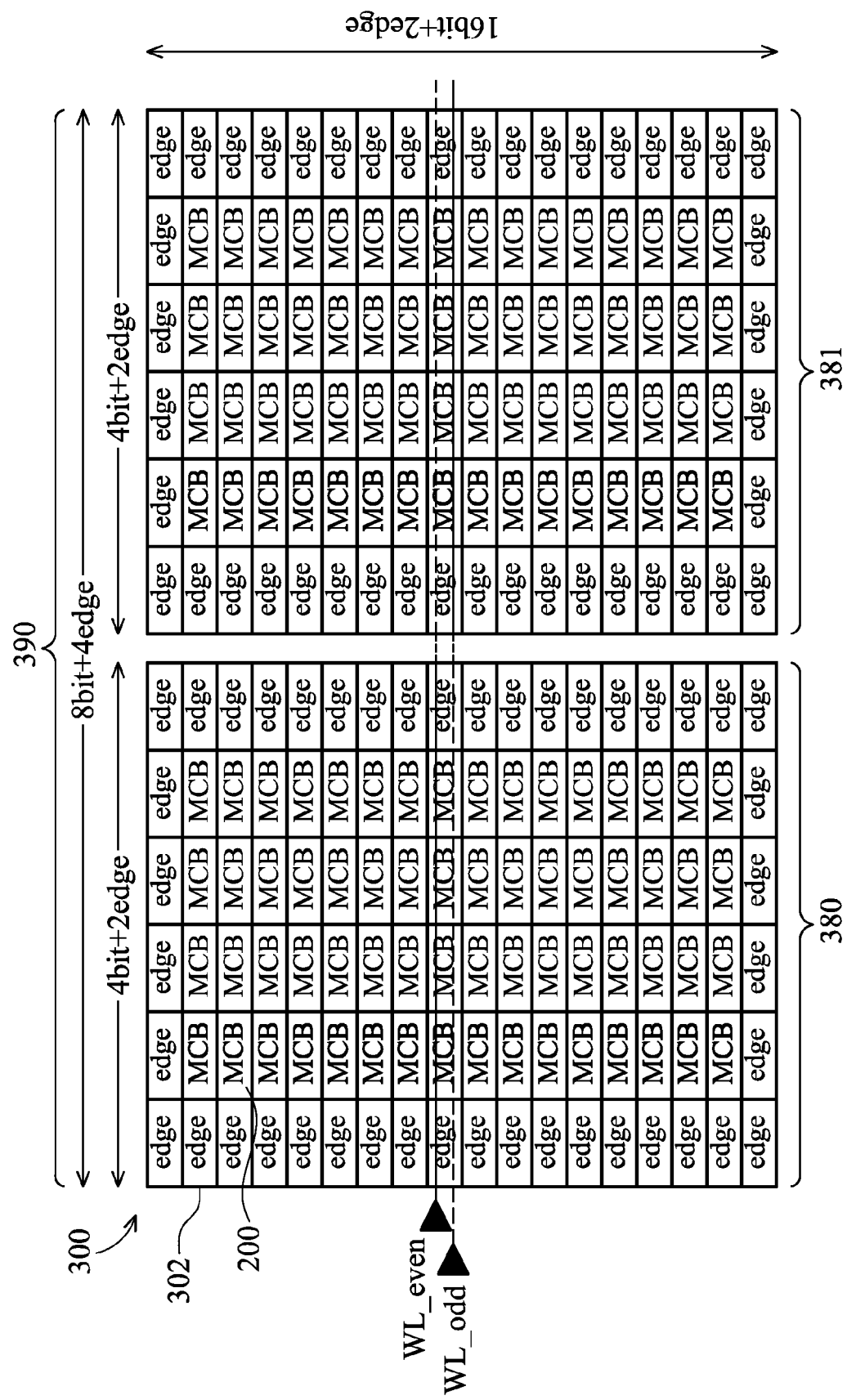
FIG. 3 is a layout diagram of a memory array.

FIG. 3 is a layout diagram of a memory bit cell array 300 suitable for use with word-line segment access. Memory 300 has 16 rows of memory bit cells (MCB) 200, with 8 bit cells per row. In this example, memory 300 has a smaller size than memory 100, solely for ease of viewing. In memory 300, one set 390 of bit cells has two word-line segments (subsets) 380, 381. Each segment 380, 381 has four bit cells. Each row has a pair of word lines, designated WL-even and WL_odd (only one of which is shown in FIG. 3). Each subset 380, 381 includes a sub-array of bit cells 200 surrounded by edge cells 302 for control circuitry (e.g., global word line drivers, word line segment drivers, or the like). Although not shown in FIG. 1, the memory 100 includes similar edge cells around each of the 32 sub-arrays 180a-180d, 181a-181d.

Figure 4:
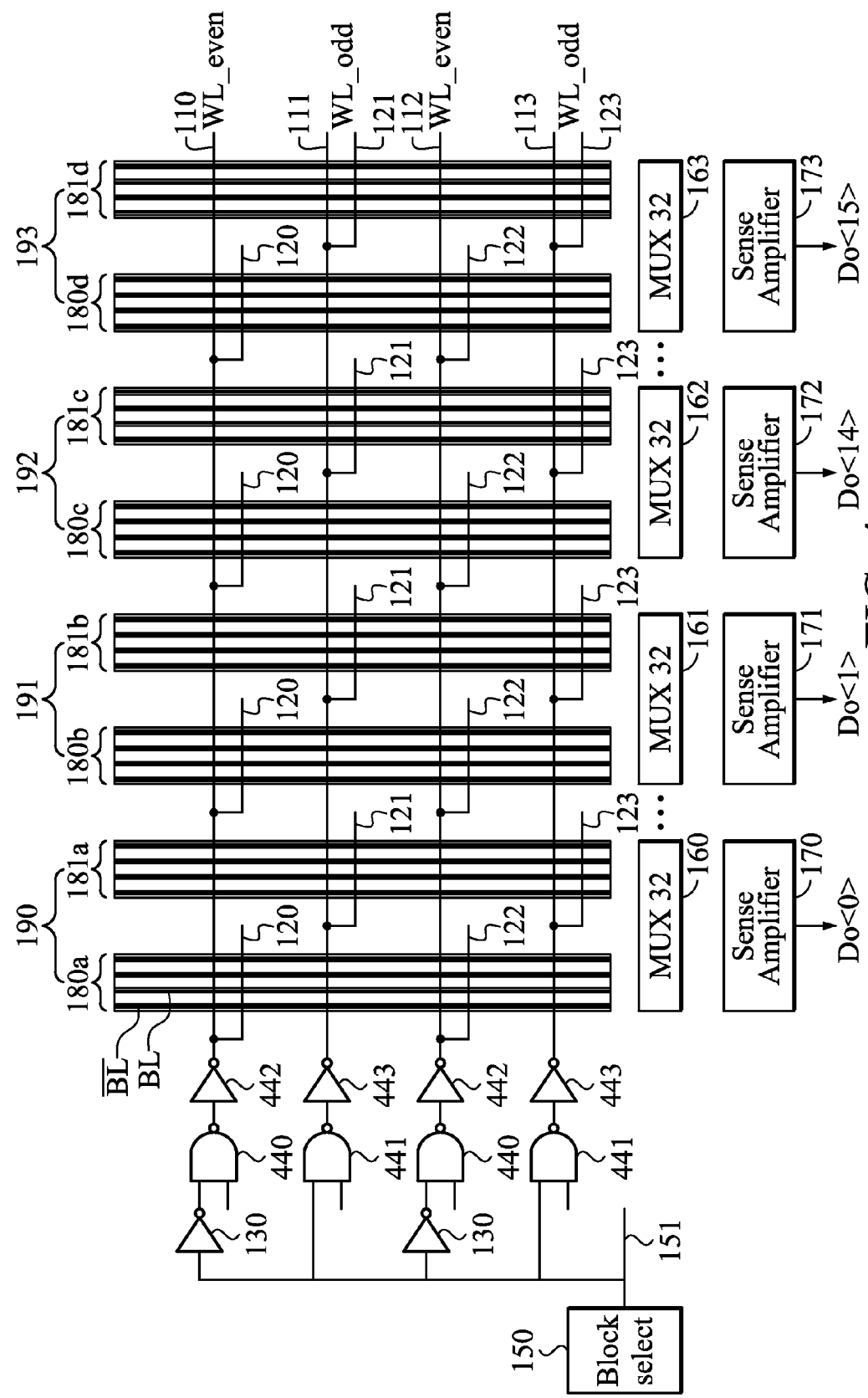
FIG. 4 is a schematic diagram of a memory array having an alternative word line segment driver.

Although FIG. 1 shows a particular example of word line segment drivers, other designs may be used. For example, FIG. 4 shows an alternative configuration using basic components to form the word line segment drivers. Components of FIG. 4 that are the same as those in FIG. 1 are indicated by like reference numerals. In FIG. 4, the word line segment drivers include inverter 130, NAND gate 440 and inverter 442 for the WL_even word lines, and NAND gate 441 and inverter 443 for the WL_odd word lines. Other implementations of the word line segment drivers may be substituted.

In a memory having only two subsets per set (e.g., subsets 180a, 181a in set 190), the first subsets 180a-180d alternate with the second subsets 181a-181d, and one sense amplifier 170 is provided per set 190. In other embodiments (not shown) having more than two (e.g., 4 or 8) subsets per set, the subsets are arranged in a sequence and one sense amplifier is provided per set. For example, each set may have a sequence of four subsets of the bit line pairs coupled to a common sense amplifier.

For example, in more general embodiments, each word line has a plurality of sets of word line segments, each set having N word line segments, where N is an integer greater than one (e.g., 2, 4, 8, 16, etc.). Each set of word line segments includes at least one of the first plurality of bit cells and at least one of the second plurality of bit cells. In some embodiments, each set of word line segments includes a plurality (e.g., 4, 8, 16, or 32) of the first plurality of bit cells and the same number of the second plurality of bit cells. Each set has a respective shared sense amplifier selectively connectable to bit cells in each word line segment in that set, and configured to receive signals from whichever of the bit cells in the set is activated by the respective word line segment driver thereof at a given time. Word line segment driver circuitry are provided so that only 1/N times the total number of bit line pairs are developed and pre-charged during a read access.

Figure 5:
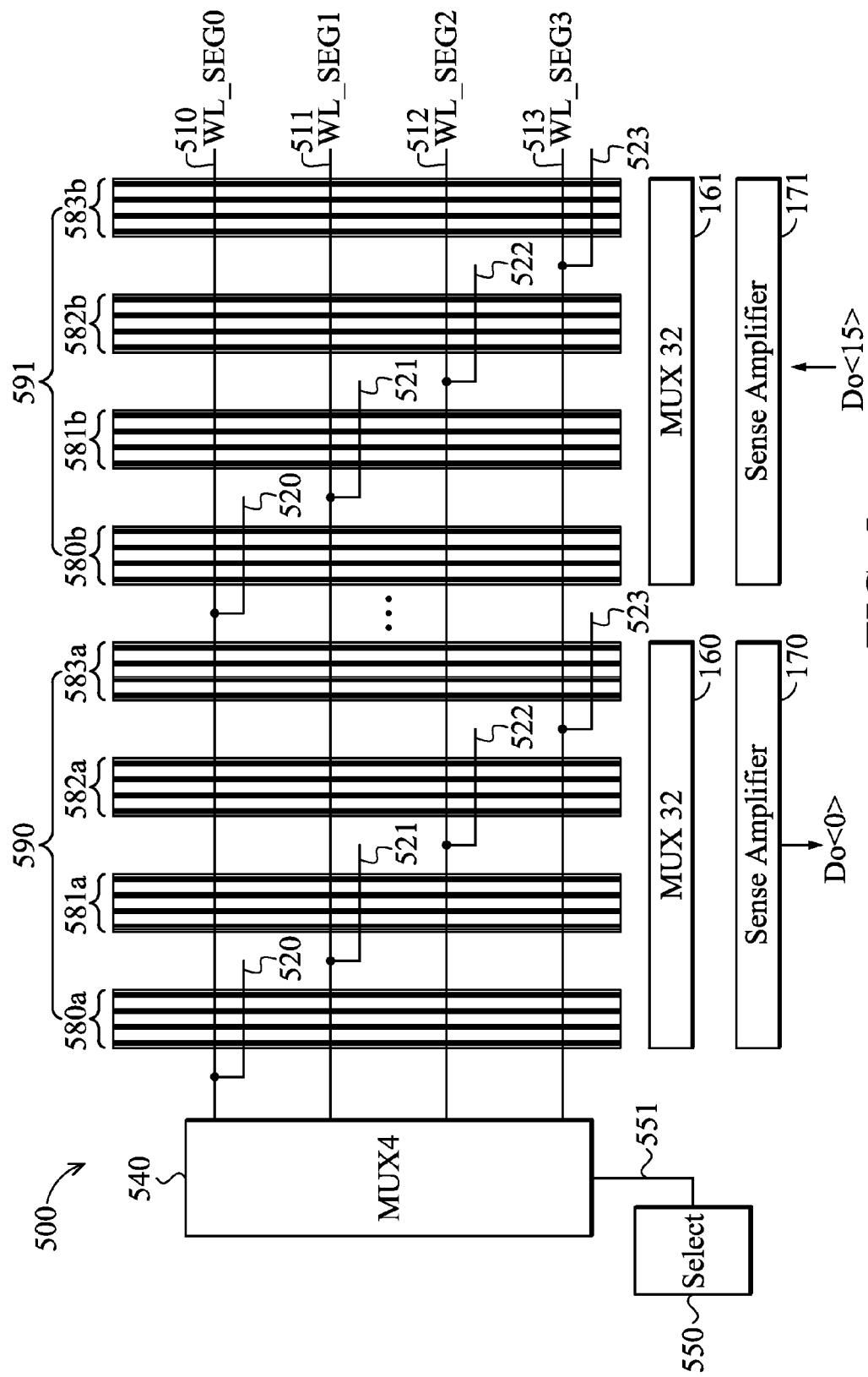
FIG. 5 is a schematic diagram of a memory array having additional word line segment drivers.

For example, FIG. 5 shows a memory array 500, which may be the same size as array 100. In array 500, there are 16 sets 590-591 (only two of which are shown), and the number N of word line segments in each set is four. Thus set 590 has four word-line segments 180a, 181a, 182a, 183a, and set 591 has four word-line segments 180b, 181b, 182b, 183b. Each word-line segment 180a-180b, 181a-181b, 182a-182b, 183a-183b has eight pairs of bit lines. In other words, compared to FIG. 1, the number of word-line segments per set is doubled, and the number of bit line pairs per word-line segment is reduced by half. In place of the word line segment drivers, a four-to-one multiplexer 540 may be provided, so that only one fourth of the bit line pairs are developed and pre-charged during an access. The block selector 550 is also modified, to transmit a two-bit signal for controlling multiplexer 540. In other embodiments, logic may be substituted to perform the function of the multiplexer.

Although the example of FIG. 5 uses fewer bit cells 200 per word-line segment while doubling the number of word line segments, this is only based on the size of the example memory (512×1024). The number of bit cells per word-line segment, number of segments per set, and the number of sets can be varied to accommodate any word length and number of output bits. In both of the examples of FIGS. 1 and 5, the number of sense amplifiers 170-173 is the same as the number of output bits; there is no need to multiplex the outputs of the sense amplifiers to match the number of output bits, reducing the chip area. In other embodiments, the number of sense amplifiers may be larger (e.g., 2×, 4×, etc.) than the number of output bits, in which case a multiplexer is provided to select a subset of the sense amplifier output signals for output from the memory.

In embodiments having N greater than two, additional line and via layers may be added to the BEOL interconnect structure to accommodate additional connections provided for the word-line segments 180a-180b, 181a-181b, 182a-182b, 183a-183b.

Figure 6:
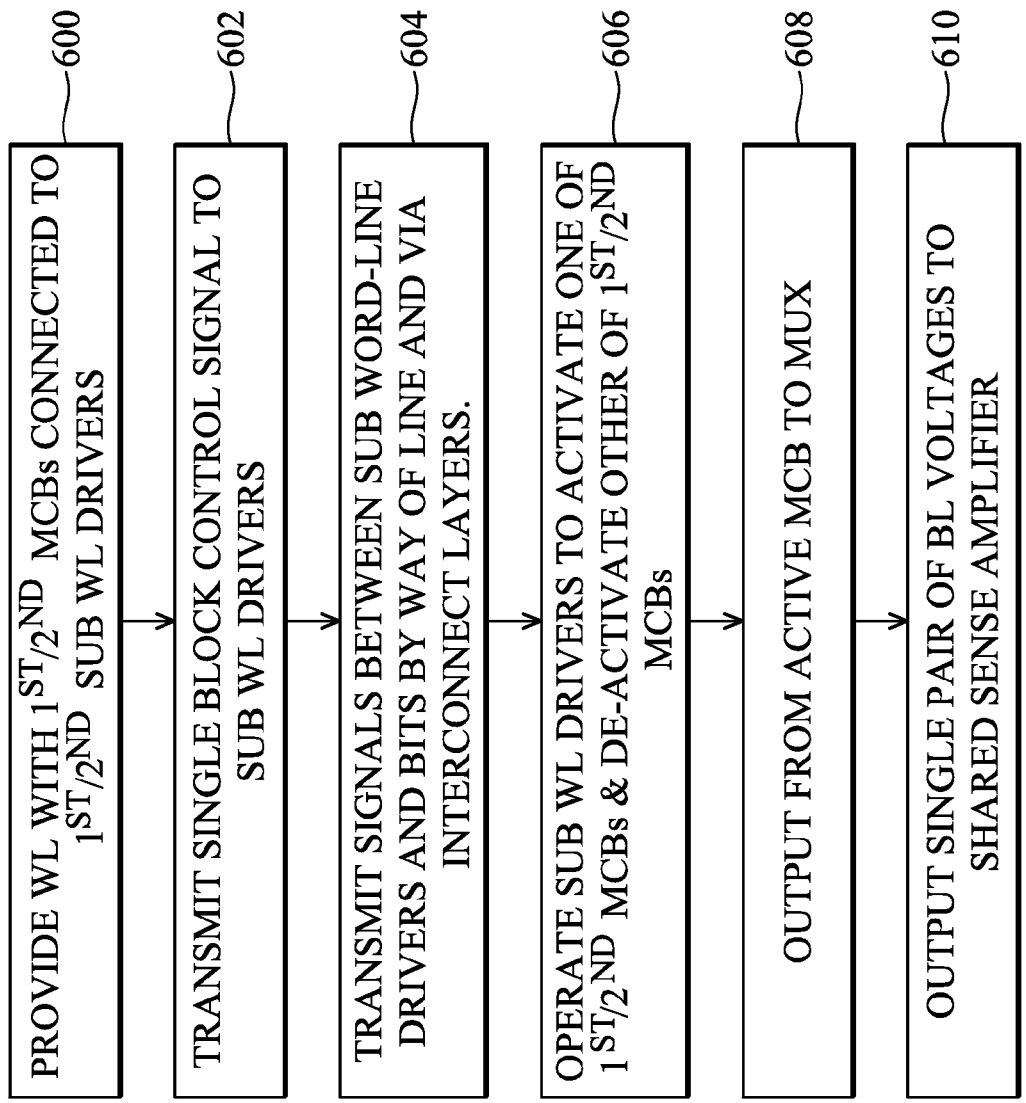
FIG. 6 is a flow chart of a method of operating the memory of FIG. 1.

FIG. 6 is a flow chart of a method of operating the memory 100.

At step 600, a memory is provided having a first plurality of bits cells connected to a first word line segment driver and a second plurality of bits cells connected to a second word line segment driver. The first and second pluralities of bit cells are arranged along the same word line of the memory. The first and second pluralities of bit cells are arranged in alternating first and second word-line segments. Each first word-line segment has a subset of the first plurality of bit cells, and each second word-line segment has a subset of the second plurality of bit cells.

At step 602, a single block select signal is transmitted to the first and second word line segment drivers, so as to cause one of the first and second word line segment drivers to activate the at least one bit cell thereof, and cause the other of the first and second word line segment drivers to de- the at least one bit cell thereof.

At step 604, signals are transmitted between the first word line segment driver and the first plurality of bits by way of line and via interconnect layers, and signals are transmitted between the second word line segment driver and the second plurality of bits by way of the line and via interconnect layers.

At step 606, the first and second word line segment drivers are selectively operated to activate one of the first and second pluralities of bit cells at a given time, to the exclusion of the other of the first and second pluralities of bit cells. In some embodiments, one of the first and second word-line segments in each pair are activated, and the other of the first and second word-line segments in each pair are de-activated during a memory access.

At step 608, data are output from each of the pairs of word line segments to a respective multiplexer, wherein adjacent first and second word line segments are assigned to respective pairs. The multiplexer is connected for outputting a single pair of bit line voltages to the shared sense amplifier.

At step 610, the multiplexer outputs data from a bit cell in a set including at least one of the first plurality of bit cells and at least one of the second plurality of bit cells coupled to a shared sense amplifier. Thus, the sense amplifier receives signals from whichever of the one first bit cell or the one second bit cell is activated by the respective word line segment driver thereof at a given time.

In some embodiments, a memory comprises a row of bit cells, including a first plurality of bit cells and a second plurality of bit cells. A first word line segment driver is connected to the first plurality of bits cells and a second word line segment driver is connected to the second plurality of bits cells. The first and second word line segment drivers are selectively operable for activating one of the first and second pluralities of bit cells at a time to the exclusion of the other of the first and second pluralities of bit cells. A shared sense amplifier is coupled to at least one of the first plurality of bit cells and at least one of the second plurality of bit cells, so that the shared sense amplifier is configured to receive signals from whichever of the one first bit cell or the one second bit cell is activated by the respective word line segment driver thereof at a given time.

In some embodiments, a memory comprises a first row of bit cells including: a first plurality of bit cells divided among a plurality of first subsets, and a second plurality of bit cells divided among a plurality of second subsets. The first row of bit cells are arranged in a plurality of sets. Each set includes a respective one of the first subsets and a respective one of the second subsets. The plurality of sets are arranged so that none of the first subsets are adjacent to each other, and none of the second subsets are adjacent to each other. A first word line segment driver is connected to the first plurality of bits cells and a second word line segment driver connected to the second plurality of bits cells. The first and second word line segment drivers are selectively operable for activating one of the first and second pluralities of bit cells at a time to the exclusion of the other of the first and second pluralities of bit cells. A plurality of shared sense amplifiers are provided. Each set of bit cells are coupled to a respective shared sense amplifier. Each sense amplifier is configured to receive signals from whichever of the first plurality of bit cells or the second plurality of bit cells is activated by the respective word line segment driver thereof at a given time.

In some embodiments, a method comprises providing a first plurality of bits cells connected to a first word line segment driver and a second plurality of bits cells connected to a second word line segment driver, the first and second pluralities of bit cells being arranged along the same word line of a memory. The first and second word line segment drivers are selectively operated to activate one of the first and second pluralities of bit cells at a given time, to the exclusion of the other of the first and second pluralities of bit cells. data are output from a bit cell in a set including at least one of the first plurality of bit cells and at least one of the second plurality of bit cells coupled to a shared sense amplifier, so that the sense amplifier receives signals from whichever of the one first bit cell or the one second bit cell is activated by the respective word line segment driver thereof at a given time.

Although the subject matter has been described in terms of exemplary embodiments, it is not limited thereto. Rather, the appended claims should be construed broadly, to include other variants and embodiments, which may be made by those skilled in the art.

What is claimed is:

1. A memory comprising:
a row of bit cells, including a first plurality of bit cells and a second plurality of bit cells;
a first word line on a first side of the row of bit cells, and a second word line on a second side of the row of bit cells, the first and second word lines being adjacent to each other;
a first word line segment driver connected by the first word line, but not by the second word line, to the first plurality of bits cells and a second word line segment driver connected by the second word line, but not by the first word line, to the second plurality of bit cells, the first and second word line segment drivers being selectively operable for activating one of the first and second pluralities of bit cells at a time to the exclusion of the other of the first and second pluralities of bit cells; and
a shared sense amplifier coupled to at least one of the first plurality of bit cells and at least one of the second plurality of bit cells, so that the shared sense amplifier is configured to receive signals from whichever of the one first bit cell or the one second bit cell is activated by the respective word line segment driver thereof at a given time.

2. The memory of claim 1, wherein:
the word line has a plurality of sets of word line segments, each set having N word line segments, where N is an integer greater than one, each set of word line segments includes at least one of the first plurality of bit cells and at least one of the second plurality of bit cells; and
each set has a respective shared sense amplifier selectively connectable to bit cells in each word line segment in that set, and configured to receive signals from whichever of the bit cells in the set is activated by the respective word line segment driver thereof at a given time.

3. The memory of claim 2, wherein:
each word line segment includes at least two of the first plurality of bit cells and at least two of the second plurality of bit cells.

4. The memory of claim 1, wherein:
the first and second word line segment drivers are configured differently from each other.

5. The memory of claim 4, wherein:
both of the first and second word line segment drivers are connected to receive a shared activation signal for activating only one of the first and second pluralities of bit cells at a time to the exclusion of the other of the first and second pluralities of bit cells.

6. The memory of claim 5, wherein:
one of the first and second word line segment drivers includes an AND gate, and the other of the first and second word line segment drivers includes an AND gate and an inverter.

7. The memory of claim 5, wherein:
one of the first and second word line segment drivers includes a NAND gate, and the other of the first and second word line segment drivers includes an NAND gate and an inverter.

8. The memory of claim 1, further comprising:
a block selector for selecting one of the first plurality of bit cells and the second plurality of bit cells to be accessed, the block selector being connected to each of the first and second word line segment drivers.

9. The memory of claim 8, wherein the block selector is a switch.

10. The memory of claim 1, further comprising a multiplexer connected to receive first data from the at least one of the first plurality of bit cells and second data from the at least one of the second plurality of bit cells, the multiplexer having an output connected to the sense amplifier for selectively outputting one of the group consisting of the first data and the second data.

11. A memory comprising:
a first row of bit cells including: a first plurality of bit cells divided among a plurality of first subsets, and a second plurality of bit cells divided among a plurality of second subsets;
the first row of bit cells being arranged in a plurality of sets, each set including a respective one of the first subsets and a respective one of the second subsets, the plurality of sets arranged so that none of the first subsets are adjacent to each other, and none of the second subsets are adjacent to each other;
a first word line on a first side of the row of bit cells, and a second word line on a second side of the row of bit cells, the first and second word lines being adjacent to each other;
a first word line segment driver connected by the first word line, but not by the second word line, to the first plurality of bits cells and a second word line segment driver connected by the second word line, but not by the first word line, to the second plurality of bit cells, the first and second word line segment drivers being selectively operable for activating one of the first and second pluralities of bit cells at a time to the exclusion of the other of the first and second pluralities of bit cells; and
a plurality of shared sense amplifiers, each set of bit cells being coupled to a respective shared sense amplifier, each sense amplifier configured to receive signals from whichever of the first plurality of bit cells or the second plurality of bit cells is activated by the respective word line segment driver thereof at a given time.

12. The memory of claim 11, further comprising a plurality of multiplexers, each multiplexer connected to receive first data from a respective one of the first subsets and to receive second data from a respective one of the second subsets, each multiplexer having an output connected to a respective sense amplifier for selectively outputting one of the group consisting of the first data and the second data.

13. The memory of claim 11, wherein:
the first row of bit cells is included in a plurality of rows of bit cells, each row having a respective first plurality of bit cells divided among a plurality of first subsets, and a respective second plurality of bit cells divided among a plurality of second subsets;
each set of bit cells includes a respective one of the first subsets in each row and a respective one of the second subsets in each row; and
each row has a respective first word line segment driver connected to the first plurality of bits cells thereof and a respective second word line segment driver connected to the respective second plurality of bits cells thereof, the first and second word line segment drivers being selectively operable for activating one of the first and second pluralities of bit cells in that row at a time to the exclusion of the other of the first and second pluralities of bit cells in that row.

14. The memory of claim 13, wherein each of the first word line segment drivers and each of the second word line segment drivers are coupled to receive the same block select signal, for activating one of the first and second plurality of bit cells and deactivating the other of the first and second plurality of bit cells.

15. A method comprising:
providing a first plurality of bits cells connected by a first word line, but not by a second word line, to a first word line segment driver and a second plurality of bit cells connected by the second word line, but not by the first word line, to a second word line segment driver, the first and second pluralities of bit cells being arranged along the same row of a memory the first and second word lines being adjacent to each other;
selectively operating the first and second word line segment drivers to activate one of the first and second pluralities of bit cells at a given time, to the exclusion of the other of the first and second pluralities of bit cells;
outputting data from a bit cell in a set including at least one of the first plurality of bit cells and at least one of the second plurality of bit cells coupled to a shared sense amplifier, so that the sense amplifier receives signals from whichever of the one first bit cell or the one second bit cell is activated by the respective word line segment driver thereof at a given time.

16. The method of claim 15, further comprising:
transmitting a single block select signal to the first and second word line segment drivers, so as to cause one of the first and second word line segment drivers to activate the at least one bit cell thereof, and cause the other of the first and second word line segment drivers to de- the at least one bit cell thereof.

17. The method of claim 15, wherein the first and second pluralities of bit cells are arranged in alternating first and second word-line segments, each first word-line segment having a subset of the first plurality of bit cells, each second word-line segment having a subset of the second plurality of bit cells.

18. The method of claim 17, wherein adjacent first and second word line segments are assigned to respective pairs, the method further comprising outputting data from each of the pairs of word line segments to a respective multiplexer, the multiplexer connected for outputting a single pair of bit line voltages to the shared sense amplifier.

19. The method of claim 17, wherein adjacent first and second word line segments are assigned to respective pairs, the method further comprising
activating one of the first and second word-line segments in each pair, and de-activating the other of the first and second word-line segments in each pair during a memory access.

20. The method of claim 15, further comprising transmitting signals between the first word line segment driver and the first plurality of bits by way of line and via interconnect layers, and transmitting signals between the second word line segment driver and the second plurality of bits by way of the line and via interconnect layers.

21. The memory of claim 1, wherein the memory is a static random access memory.

* * * * *